(12) United States Patent
Nada et al.

(10) Patent No.: US 12,040,421 B2
(45) Date of Patent: Jul. 16, 2024

(54) AVALANCHE PHOTODIODE

(71) Applicant: Nippon Telegraph and Telephone Corporation, Tokyo (JP)

(72) Inventors: Masahiro Nada, Musashino (JP); Shoko Tatsumi, Musashino (JP); Yuki Yamada, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 5 days.

(21) Appl. No.: 17/776,552

(22) PCT Filed: Nov. 18, 2019

(86) PCT No.: PCT/JP2019/045086
§ 371 (c)(1),
(2) Date: May 12, 2022

(87) PCT Pub. No.: WO2021/100088
PCT Pub. Date: May 27, 2021

(65) Prior Publication Data
US 2022/0399472 A1    Dec. 15, 2022

(51) Int. Cl.
*H01L 31/107*    (2006.01)
*H01L 31/0232*   (2014.01)

(52) U.S. Cl.
CPC .... *H01L 31/1075* (2013.01); *H01L 31/02327* (2013.01)

(58) Field of Classification Search
CPC ........... H01L 31/1075; H01L 31/02327; H01L 31/03046
See application file for complete search history.

(56) References Cited

U.S. PATENT DOCUMENTS

| | | | | |
|---|---|---|---|---|
| 5,654,578 A | * | 8/1997 | Watanabe | B82Y 20/00 257/458 |
| 6,350,998 B1 | * | 2/2002 | Tsuji | H01L 31/03046 257/190 |
| 8,575,650 B2 | | 11/2013 | Ishibashi et al. | |
| 2003/0047752 A1 | * | 3/2003 | Campbell | H01L 31/1852 257/432 |
| 2007/0090397 A1 | | 4/2007 | Nakata et al. | |
| 2007/0158659 A1 | * | 7/2007 | Bensce | H01L 31/11 257/79 |

(Continued)

FOREIGN PATENT DOCUMENTS

| | | |
|---|---|---|
| JP | 2005-142455 A | 6/2005 |
| JP | 2010-147177 A | 7/2010 |

(Continued)

OTHER PUBLICATIONS

Feng Ma et al., *Monte Carlo Simulations of the Bandwidth of InAlAs Avalanche Photodiodes*, IEEE Transactions on Electron Devices, vol. 50, No. 11, Nov. 2003, pp. 2291-2294.

(Continued)

*Primary Examiner* — Sitaramarao S Yechuri
(74) *Attorney, Agent, or Firm* — Workman Nydegger

(57)  ABSTRACT

There is provided an element structure of an avalanche photodiode that can operate in a high gain state while having high reliability and low noise property. There is produced an avalanche photodiode including at least a multiplication layer and a light absorbing layer between first and second semiconductor contact layers, in which an area of the first semiconductor contact layer is at least smaller than an area of the multiplication layer, the avalanche photodiode having an electric field relaxation layer configured to be depleted at an operating voltage between the first semiconductor contact layer and the multiplication layer.

6 Claims, 5 Drawing Sheets

(56) References Cited

U.S. PATENT DOCUMENTS

| 2011/0073973 | A1* | 3/2011 | Nakaji | H01L 31/105 |
| | | | | 257/E31.128 |
| 2011/0241150 | A1 | 10/2011 | Ishibashi et al. | |
| 2018/0331246 | A1 | 11/2018 | Nada et al. | |
| 2019/0157472 | A1 | 5/2019 | Nada et al. | |

FOREIGN PATENT DOCUMENTS

| JP | 2014-003083 A | 1/2014 |
| WO | 2005/078809 A1 | 8/2005 |
| WO | WO2016088668 A1 | 6/2016 |
| WO | WO2017183568 A1 | 10/2017 |

OTHER PUBLICATIONS

Masahiro Nada et al., *Design and Performance of High-Speed Avalanche Photodiodes for 100-GB/s Systems and Beyond*, Journal of Lightwave Technology, vol. 33, No. 5, Mar. 1, 2015, pp. 984-990.

Ning Duan et al., *310 GHz Gain-Bandwidth Product Ge/Si Avalanche Photodetector for 1550 nm Light Detection*, Optics Express, vol. 20, No. 10, May 7, 2012, pp. 11031-11036.

Madison E. Woodson et al., *Low-Noise AlInAsSb Avalanche Photodiode*, Applied Physics Letters, vol. 108, Feb. 22, 2016, pp. 081102-081102-4.

Masahiro Nada et al., *Triple-Mesa Avalanche Photodiode with Inverted P-Down Structure for Reliability and Stability*, Journal of Lightwave Technology, vol. 32, No. 8, Apr. 15, 2014, pp. 1543-1548.

Masahiro Nada et al., *Inverted InAlAs/InGaAs Avalanche Photodiode with Low-High-Low Electric Field Profile*, Japanese Journal of Applied Physics, vol. 51, 2012, pp. 02GB03-1-02BG03-4.

Masahiro Nada et al., *High-Speed Avalanche Photodiode for Data Center Networks*, ThD3-1, OECC/PS2016, pp. 1-3.

Fumito Nakajima et al., *High-Speed Avalanche Photodiode and High-Sensitivity Receiver Optical Subassembly for 100-GB/s Ethernet*, Journal of Lightwave Technology, vol. 34, No. 2, Jan. 15, 2016, pp. 243-248.

* cited by examiner

AVALANCHE PHOTODIODE

TECHNICAL FIELD

The present invention relates to a structure of an avalanche photodiode capable of an increased sensitivity.

BACKGROUND ART

An avalanche photodiode (APD) is a type of photodiode (PD) utilizing a phenomenon called avalanche multiplication in which photocurrent is amplified by an intense electric field within a semiconductor layer, and is a light receiving element capable of achieving a higher receiving sensitivity compared to a typical photodiode due to its high photoelectric conversion efficiency, which is widely applied to an image sensor and optical communication. In particular, in optical communication applications, as compared to an optical receiver using a typical PD, in the case of an optical receiver using an APD (APD optical receiver), a transmission distance of an optical signal can be extended, so that the APD optical receiver is widely used in metro-access applications.

Examples of a trade-off that dominates receiving sensitivity performance of the APD optical receiver in optical communications include a trade-off between a gain and a bandwidth of the APD and a trade-off between a gain and an excessive noise of the APD. The trade-off between a gain and a bandwidth is often known as a gain-bandwidth product (GBP) of the APD (NPL 1). An operating band of the APD decreases along with an increased gain of the APD, and thus improvement in reception sensitivity as an APD optical receiver saturates when the operating band becomes insufficient for a modulation rate applied to the APD.

In addition, noise current also rises along with the increased gain of the APD (NPL 2). This excessive noise specific to the APD is caused by an amplification process of carriers in a multiplication layer that amplifies photocurrent inside the APD, and an extent of noise is determined by a ratio of an electron collision ionization rate to a hole collision ionization rate (ionization rate ratio) specific to a material of the multiplication layer. Accordingly, in order to obtain characteristics of a high gain and low noise in the APD, it is necessary to carefully select the material of the multiplication layer.

For example, for an APD composed of a Group III to V compound semiconductor, InP and InAlAs have been used as the multiplication layer due to a constraint that InP and InAlAs are lattice-matched with an InP substrate and an InGaAs light absorbing layer. In particular, InAlAs is widely used as the material of the multiplication layer of an APD having a high speed and a high sensitivity because InAlAs has a smaller ionization rate ratio compared to InP. Furthermore, in recent years, a material of the multiplication layer exhibiting an ionization rate ratio further smaller than that of InAlAs and a low noise property, such as InAlAsSb or Si, has also been developed (NPLs 3, 4).

In the meantime, the APD is an element that operates by applying a high voltage as compared to the typical PD and inducing a high electric field concentrically in the multiplication layer. Thus, it is generally difficult to achieve a normal operation and to ensure long-term reliability, as compared to the typical PD.

In terms of reliability, it is a requirement that no electric field be generated on the side surface of the element of the APD (NPL 5). Due to this, the APD has a structure called an "electric field constriction structure" in which a process technique such as selective diffusion, ion implantation, or the like is used to induce a high electric field intensity in the center of an element while the electric field on the side surface of the element is kept weak.

On the other hand, when this electric field constriction structure is used, electric field concentration may occur at the end of the constriction portion to generate multiplication locally in the APD. This phenomenon is often referred to as "edge breakdown" (NPL 5, FIG. 1). When edge breakdown occurs, the breakdown occurs at a voltage lower than that when the gain of the APD in the multiplication layer becomes sufficiently large, and thus, even if a material with low excessive noise is used as the multiplication layer, APD operation cannot be performed with a large gain.

In this way, in order to achieve an APD having high performance and high reliability, it is necessary to use a multiplication layer material with low noise and to employ an electric field constriction structure; however, there is a problem in that edge breakdown occurs due to the employment of the electric field constriction structure, as a result of which the APD cannot operate in a high gain state and it is difficult to heighten the sensitivity of an APD receiver.

CITATION LIST

Non Patent Literature

NPL 1: F. Ma et al., "Monte Carlo simulations of the bandwidth of InAlAs avalanche photodiodes", IEEE Trans. Electron., v50, p 2291 (2003)

NPL 2: M. Nada et al., "Design and performance of high-speed avalanche photodiodes for 100-Gb/s systems and beyond", IEEE JLT v33, p 984 (2015)

NPL 3: N. Duan et al., "310 GHz gain-bandwidth product Ge/Si avalanche photodetector for 1550 nm light detection", Opt. Express v20, p 11031 (2012)

NPL 4: M. Woodson et al., "Low-noise AlInAsSb avalanche photodiode", Appl. Phys. Lett., v108, p 081102 (2016)

NPL 5: M. Nada et al., "Triple-mesa Avalanche Photodiode With Inverted P-Down Structure for Reliability and Stability", J. Lightwave Technol., v. 32, pp. 1543-1548 (2014)

SUMMARY OF THE INVENTION

Technical Problem

As described in the Background Art, in the APD for optical communications, it is important to select a material of the multiplication layer such that excessive noise is reduced even in a high gain state. On the other hand, in order to increase the reliability of the APD, it is necessary to employ the electric field constriction structure such that no electric field is applied to the side surface of the element.

However, in the APD in the related art, when the electric field constriction structure is employed, edge breakdown makes it impossible to sufficiently increase a multiplication rate in the APD, and thus, even when a multiplication layer with low excessive noise is applied, it is impossible to sufficiently improve a reception sensitivity as the APD receiver, which is a problem.

In view of such a problem, an object of the present invention is to provide an element structure that can operate in a high gain state while having high reliability and low noise property in an avalanche photodiode.

Means for Solving the Problem

An aspect of the present invention includes the following configurations in order to achieve the object as described above.

Configuration 1

An avalanche photodiode including: a first semiconductor contact layer in contact with a first electrode; a second semiconductor contact layer in contact with a second electrode; a multiplication layer formed between the first semiconductor contact layer and the second semiconductor contact layer, wherein the first semiconductor contact layer has smaller area than a area of the multiplication layer; a light absorbing layer formed between the first semiconductor contact layer and the second semiconductor contact layer; and, an electric field relaxation layer configured to be depleted at an operating voltage between the first semiconductor contact layer and the multiplication layer.

Configuration 2

The avalanche photodiode according to Configuration 1, wherein the electric field relaxation layer has a film thickness of 100 nm or greater, and is doped in a concentration range of $1 \times 10^{15}$ cm$^{-3}$ to $1 \times 10^{17}$ cm$^{-3}$.

Configuration 3

The avalanche photodiode according to Configuration 1, wherein a band gap energy of a semiconductor constituting the electric field relaxation layer is greater than a band gap energy of the multiplication layer and is 0.8 eV or greater.

Configuration 4

The avalanche photodiode according to Configuration 1, wherein an electric field intensity of the electric field relaxation layer is 300 kV/cm or less in an operating state.

Configuration 5

The avalanche photodiode according to Configuration 1, wherein an area of the electric field relaxation layer is an area of the multiplication layer or less and greater than an area of the first semiconductor contact layer.

Configuration 6

The avalanche photodiode according to any one of Configurations 1 to 5, the avalanche photodiode having a backside illumination structure in which light to be detected is incident from a back surface side of a substrate.

Configuration 7

The avalanche photodiode having the backside illumination structure according to Configuration 6, the avalanche photodiode having a structure in which a mirror is disposed on a front surface side of the substrate to reflect light transmitted through the light absorbing layer and the reflected light is again incident on the light absorbing layer.

Effects of the Invention

As described above, according to the present invention, it is possible to provide an avalanche photodiode that can operate in a high gain state while having high reliability and low noise property.

DESCRIPTION OF EMBODIMENTS

First Embodiment

A structure of a first embodiment of the present invention will be described with reference to FIG. 1. The first embodiment is a basic structure in the present invention.

Figure 1:
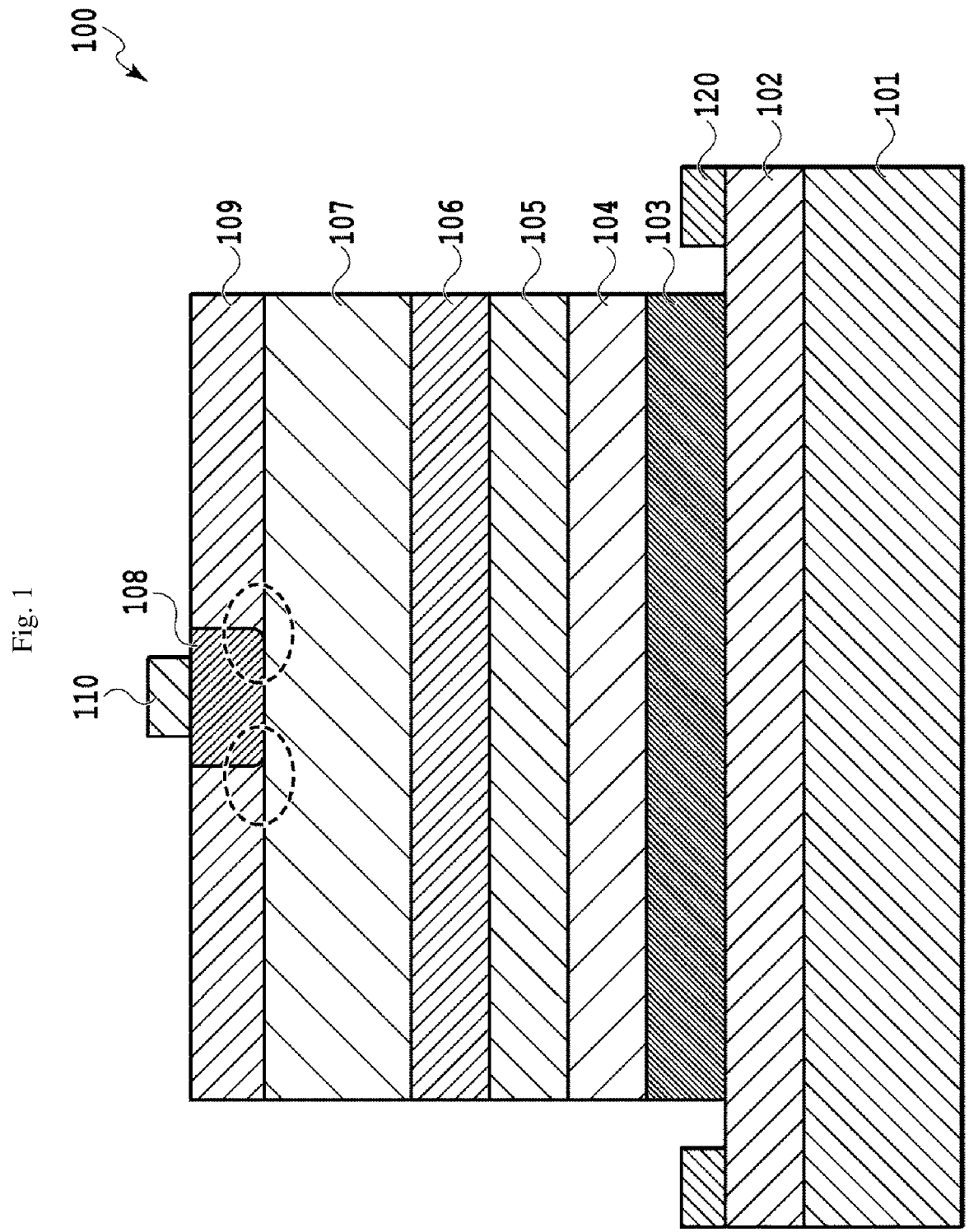
FIG. 1 is a cross-sectional view of a substrate of an avalanche photodiode according to a first embodiment.

FIG. 1 is a cross-sectional view of a substrate of an avalanche photodiode (APD) 100 for describing the first embodiment. In the first embodiment, the APD 100 has a layered structure in which a P-type InP contact layer 102, an undoped InGaAs light absorbing layer 103, a P-type InAlAs electric field control layer 104, an InAlAs multiplication layer 105, an N-type InAlAs electric field control layer 106, an InP electric field relaxation layer 107, and an InAlAs cap layer 109 are layered in this order on an InP substrate 101.

In addition, local doping is performed by a Si ion implantation method to form an N-type contact region (layer) 108 in a center of the InAlAs cap layer 109 which is the top layer, and the N-type contact region 108 is connected to a metal electrode 110, to which a voltage is applied. The P-type InP contact layer 102 which is a lower layer is also connected to a metal electrode 120 at an appropriate location, to which a voltage is applied.

Generally, because a photodiode usually operates in a reverse-biased state, the metal electrode 110 connected to the N-type contact region 108 is biased to a high potential and the metal electrode 120 connected to the P-type InP contact layer 102 is biased to a low potential to generate an electric field in the layered structure.

Because the N-type contact region 108 is selectively doped in the cap layer 109, an area of the contact region is smaller than an area of the multiplication layer 105 or the like and forms an electric field constriction structure.

It applies to the following embodiments that the same operation can be performed by reversing the polarity of an operating voltage even when the semiconductor type (P/N polarity) is reversed. Thus, in order to form the electric field constriction structure in the avalanche photodiode, an area of either of the two contact layers, that is, the first and second contact layers having different semiconductor types (P/N polarity), needs to be smaller than the area of the multiplication layer or the like between both the contact layers, and generality is not lost even if a contact layer having a smaller area is used as the first contact layer.

It is also applicable to the following embodiments that in general, an incident direction of light received by a photodiode may be any direction as long as the light can reach the light absorbing layer to generate photocarriers, and the incident direction of light is not limited.

For example, in a backside illumination structure, the avalanche photodiode can have a structure in which light to be detected is incident vertically upward from the back surface side (bottom) of the substrate to the substrate surface. In the backside illumination structure, it is possible to increase a detection efficiency by a structure in which a mirror is disposed on the front surface side of the substrate to reflect light transmitted through the light absorbing layer, and the reflected light is incident again on the light absorbing layer. It is also possible to make a structure in which light incident in a substrate in-plane direction (e.g., in a direction perpendicular to the sheet surface of the drawing) is received from other optical circuits, optical waveguides, optical fibers, or the like provided in the substrate.

Description of Operation of First Embodiment

An operation of a light receiving element according to the first embodiment in FIG. 1 will be described. When a reverse bias voltage is applied to the APD 100, an electric field intensity of the InAlAs multiplication layer 105 first increases, and at the same time, depletion of the N-type and P-type InAlAs electric field control layers 106, 104 disposed above and below the InAlAs multiplication layer 105 proceeds. After the N-type electric field control layer 106 has been depleted, an electric field intensity of the InP electric field relaxation layer 107 increases for a further applied voltage. Similarly, after the P-type electric field control layer 104 has been depleted, an electric field intensity of the InGaAs light absorbing layer 103 increases for a further applied voltage.

In order for the APD 100 to operate as a light receiving element, a photocarrier generated in the InGaAs light absorbing layer 103 needs to obtain a drift component by the electric field in the InGaAs light absorbing layer 103 to be injected to the multiplication layer 105. The injection depletes the P-type electric field control layer 104 and generates an electric field in the InGaAs light absorbing layer 103. The applied reverse bias voltage at this time is an ON voltage (Von) in this APD.

After the P-type and N-type electric field control layers 104, 106 have been depleted, the electric field intensities continue to increase in all layers of the absorbing layer 103, the multiplication layer 105, and the electric field relaxation layer 107 for a further applied voltage. Basically, an applied voltage at which the electric field intensity of the multiplication layer 105 becomes high to an extent that a gain of the APD 100 is sufficiently increased is a breakdown voltage (Vb) of the APD 100.

However, in the case of the first embodiment, electric field concentration occurs in a portion corresponding to an edge of the N-type contact layer 108 (portions surrounded by dotted lines in FIG. 1). This locally heightening electric field is referred to as an edge electric field. When the edge electric field extends to the multiplication layer 105, a multiplication rate locally increases in the multiplication layer 105 or a local tunnel current due to the edge electric field occurs, whereby a dark current (current flowing even in the absence of light input) rises suddenly at a voltage lower than that at which a sufficient gain is obtained as the APD, leading to breakdown.

In the first embodiment, by providing the electric field relaxation layer 107 between the multiplication layer 105 and the N-type contact layer 108 as illustrated in FIG. 1, it is possible to spatially separate a portion having the largest edge electric field near the N-type contact layer 108 and the multiplication layer 105. Thus, it is possible to suppress local increase of an electric field in the multiplication layer 105.

In addition, by providing the N-type electric field control layer 106, even at the operating voltage of the APD 100, it is possible to reduce the electric field intensity of the entire electric field relaxation layer 107. In this way, although the edge electric field is inevitably generated in the electric field relaxation layer 107, the intensity of the edge electric field can be reduced to an extent that local tunneling current and local multiplication are not generated in the electric field relaxation layer 107.

In order to suppress an influence of the edge electric field caused by the N-type contact layer 108 on the multiplication layer 105, the electric field relaxation layer 107 needs to have a certain thickness. Eventually, the thickness of the electric field relaxation layer 107 is designed depending on a desired band. The film thickness is desirably 100 nm or greater, and the electric field relaxation layer 107 is desirably depleted at the operating voltage. In addition, when the film thickness is greater, the effect of relaxation of the edge electric field is more expected, and the greater film thickness contributes to reduction in element capacity. On the other hand, a traveling delay of a carrier increases conversely, which limits the operating speed of the element. Accordingly, the maximum film thickness is designed depending on a desired operating speed.

According to the above-described principle, with the configuration of the first embodiment, it is possible to suppress edge breakdown even in a state where the gain of the APD is large, so that the sensitivity of the APD optical receiver can be improved.

Second Embodiment

Figure 2:
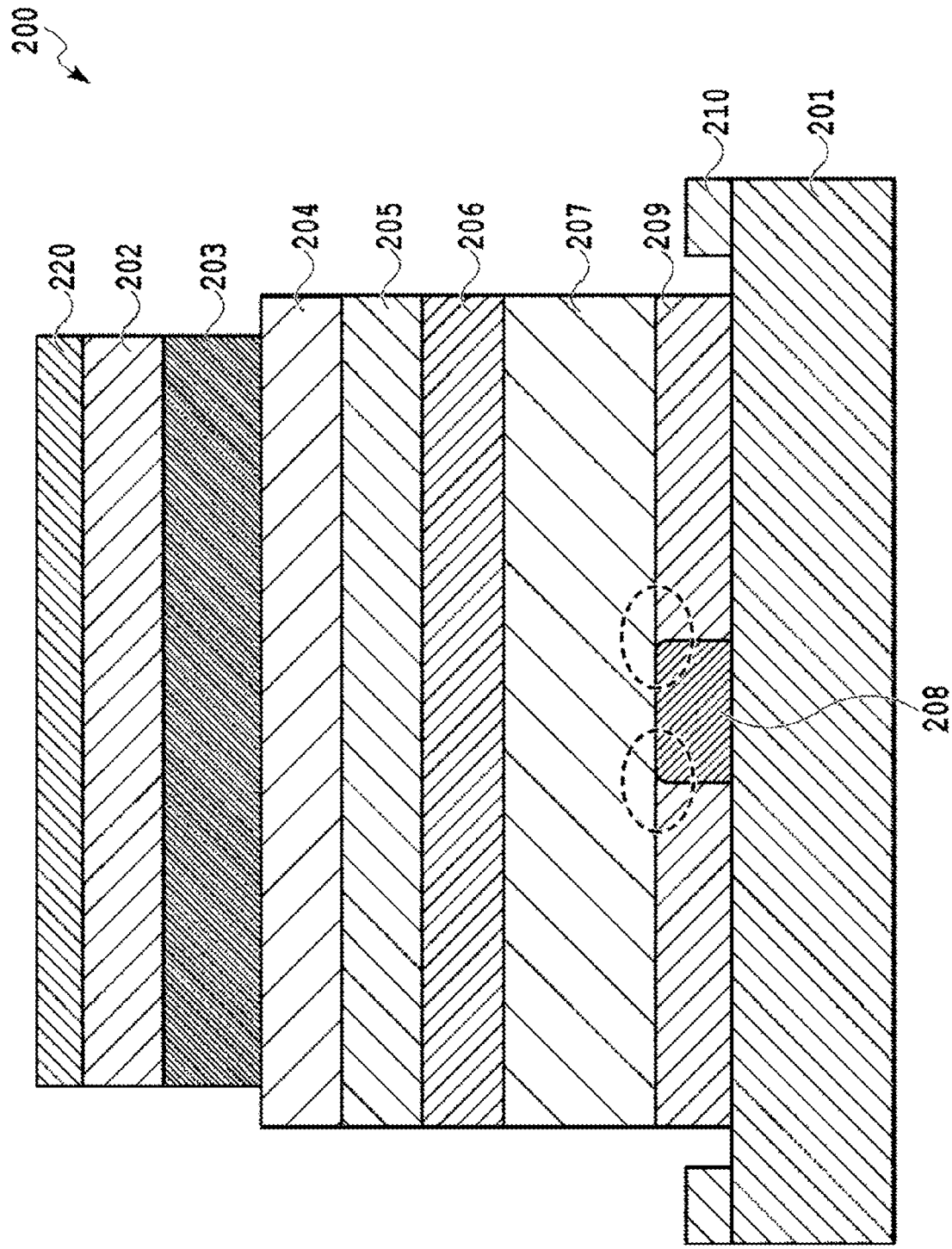
FIG. 2 is a cross-sectional view of a substrate of an avalanche photodiode according to a second embodiment.

A structure of a second embodiment of the present invention will be described with reference to FIG. 2. FIG. 2 is a cross-sectional view of a substrate of an avalanche photodiode (APD) 200 illustrating the second embodiment. In the second embodiment, generally, layering is performed in a reverse order to that of the first embodiment. Here, in the APD 200, an N-type contact region 208 is formed by growing an InP cap layer 209 on an N-type InP substrate 201, and doping the center portion thereof locally by an Si ion implantation method. The N-type contact region 208 is connected to an electrode 210 via the N-type InP substrate 201.

In the APD 200, then, an N-type InAlAs electric field relaxation layer 207, an N-type InAlAs electric field control layer 206, an InAlAs multiplication layer 205, a P-type InAlAs electric field control layer 204, an InGaAs light absorbing layer 203, and a P-type InP contact layer 202 are grown in this order and layered in a mesa structure, and the P-type InP contact layer 202 is connected to an electrode 220.

Description of Operation of Second Embodiment

An operation principle of a light receiving element according to the second embodiment is basically the same as that of the first embodiment except that a direction of the electric field is reversed in response to the order of the layers opposite to that of the first embodiment. When a voltage is applied to the APD 200, an electric field intensity of the InAlAs multiplication layer 205 first increases, and at the same time, depletion of the N-type and P-type InAlAs electric field control layers 206, 204 disposed above and below the InAlAs multiplication layer 205 proceeds. After the P-type electric field control layer 204 has been depleted, an electric field intensity of the InGaAs light absorbing layer 203 increases for a further applied voltage.

On the other hand, after the N-type electric field control layer 206 has been depleted, depletion of the N-type electric field relaxation layer 207 subsequently proceeds. Due to this, after the P-type and N-type electric field control layers have been depleted, the electric field intensities of the InAlAs multiplication layer 205 and the InGaAs absorbing layer 203 continue to increase for voltage application, but increase in the electric field intensity of the N-type InAlAs electric field relaxation layer 207 becomes very gentle for an applied voltage.

Accordingly, even when an edge electric field caused by the N-type contact layer 208 occurs, the electric field intensity of the N-type electric field relaxation layer 207 is suppressed to a very small level, and thus the edge electric field does not affect the electric field relaxation layer 207.

Here, an impurity doping concentration of the electric field relaxation layer 207 needs to be carefully designed. When the concentration is too high, the electric field relaxation layer 207 is not depleted even at the operating voltage of the APD 200, and an effect of electric field constriction on the inside of the element by the N-type contact layer 208 is not exhibited. On the other hand, when the concentration is too low, the N-type electric field relaxation layer 207 is immediately depleted for an applied voltage after depletion of the N-type electric field control layer 206, and the electric field intensity within the electric field relaxation layer 207 readily increases.

In order to mitigate the edge electric field while the effect of the concentration described above is avoided and the APD operation is properly ensured, the impurity concentration only needs to be about $1\times10^{15}$ cm$^{-3}$ to $1\times10^{17}$ cm$^{-3}$, and the electric field intensity of the electric field relaxation layer 207 at a desired operating voltage of the APD 200 only needs to be 300 kV/cm.

According to the above-described principle, with the configuration of the second embodiment, it is possible to suppress edge breakdown even in a state where the gain of the APD is large, so that the sensitivity of the APD optical receiver can be improved.

Third Embodiment

Figure 3:
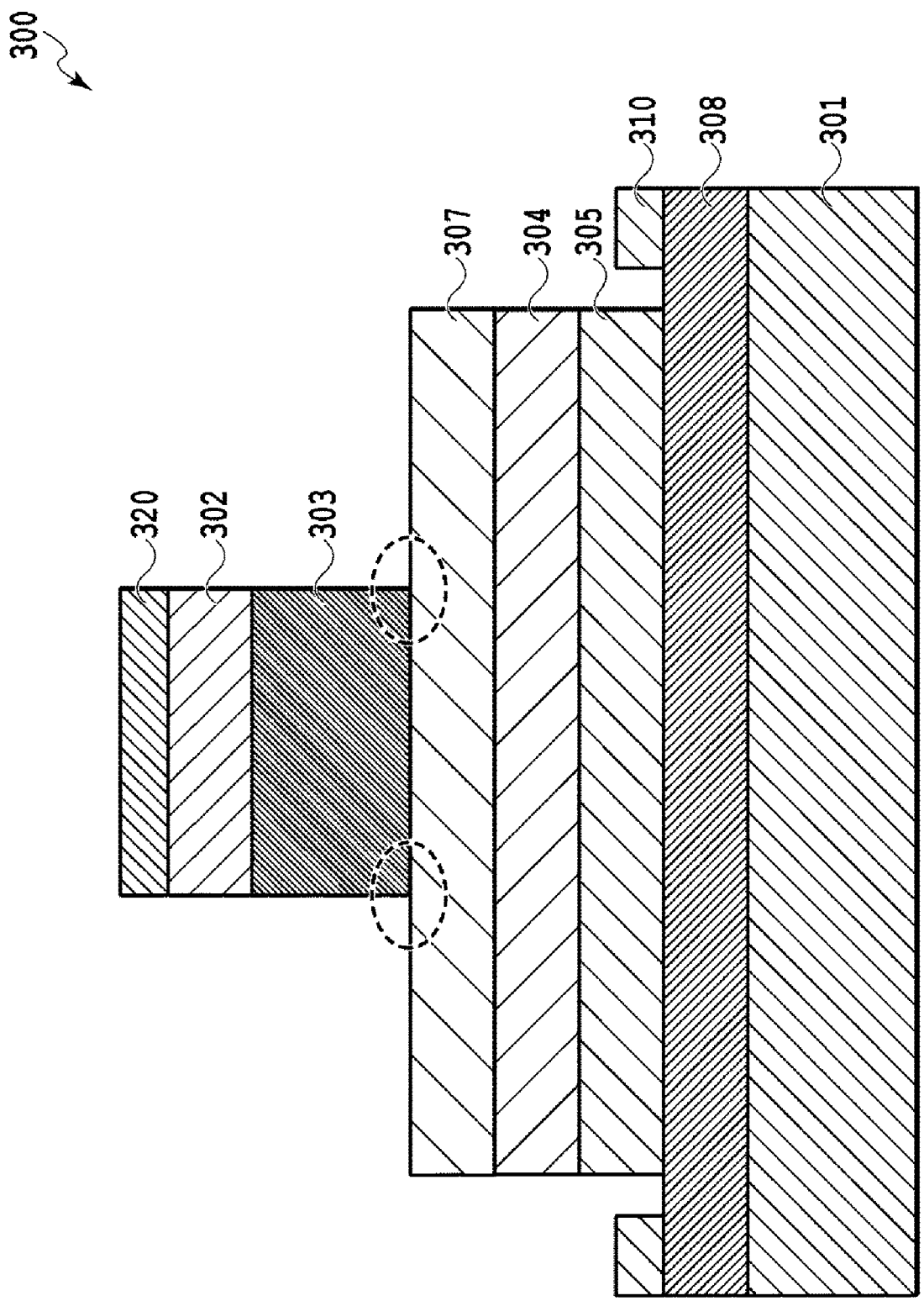
FIG. 3 is a cross-sectional view of a substrate of an avalanche photodiode according to a third embodiment.

A structure of a third embodiment of the present invention will be described with reference to FIG. 3. FIG. 3 is a cross-sectional view of a substrate of an avalanche photodiode (APD) 300 illustrating the third embodiment. In the third embodiment, unlike the first and second embodiments, the APD 300 is formed based on silicon (Si) rather than a compound semiconductor, and germanium (Ge) is used for a light absorbing layer 303.

In the APD 300 in FIG. 3, an N-type Si contact layer 308, an Si multiplication layer 305, a P-type Si electric field control layer 304, an Si electric field relaxation layer 307, a Ge light absorbing layer 303, and a P—Ge contact layer 302 are grown in this order on a Si substrate 301 and layered in a mesa structure, and the P—Ge contact layer 302 is connected to an electrode 320.

An operation principle of a light receiving element according to the third embodiment is basically the same as that of the first embodiment except for a direction of an electric field and a structure of each layer. When a voltage is applied to the APD 300, an electric field intensity of the Si multiplication layer 305 first increases, and at the same time, depletion of the P-type Si electric field control layer 304 disposed as the upper layer thereof proceeds. After the P-type Si electric field control layer 304 has been depleted, electric field intensities of the Si electric field relaxation layer 307 and the Ge light absorbing layer 303 increase for a further applied voltage.

Accordingly, even when an edge electric field caused by the Ge absorbing layer 303 occurs, the Si multiplication layer 305 is not affected by the edge electric field, and an electric field intensity of the Si electric field relaxation layer 307 is suppressed to a very small level, so that the edge electric field does not affect the electric field relaxation layer.

According to the above-described principle, with the configuration of the third embodiment, it is possible to suppress edge breakdown even in a state where the gain of the APD is large, so that the sensitivity of the APD optical receiver can be improved.

Fourth Embodiment

Figure 4:
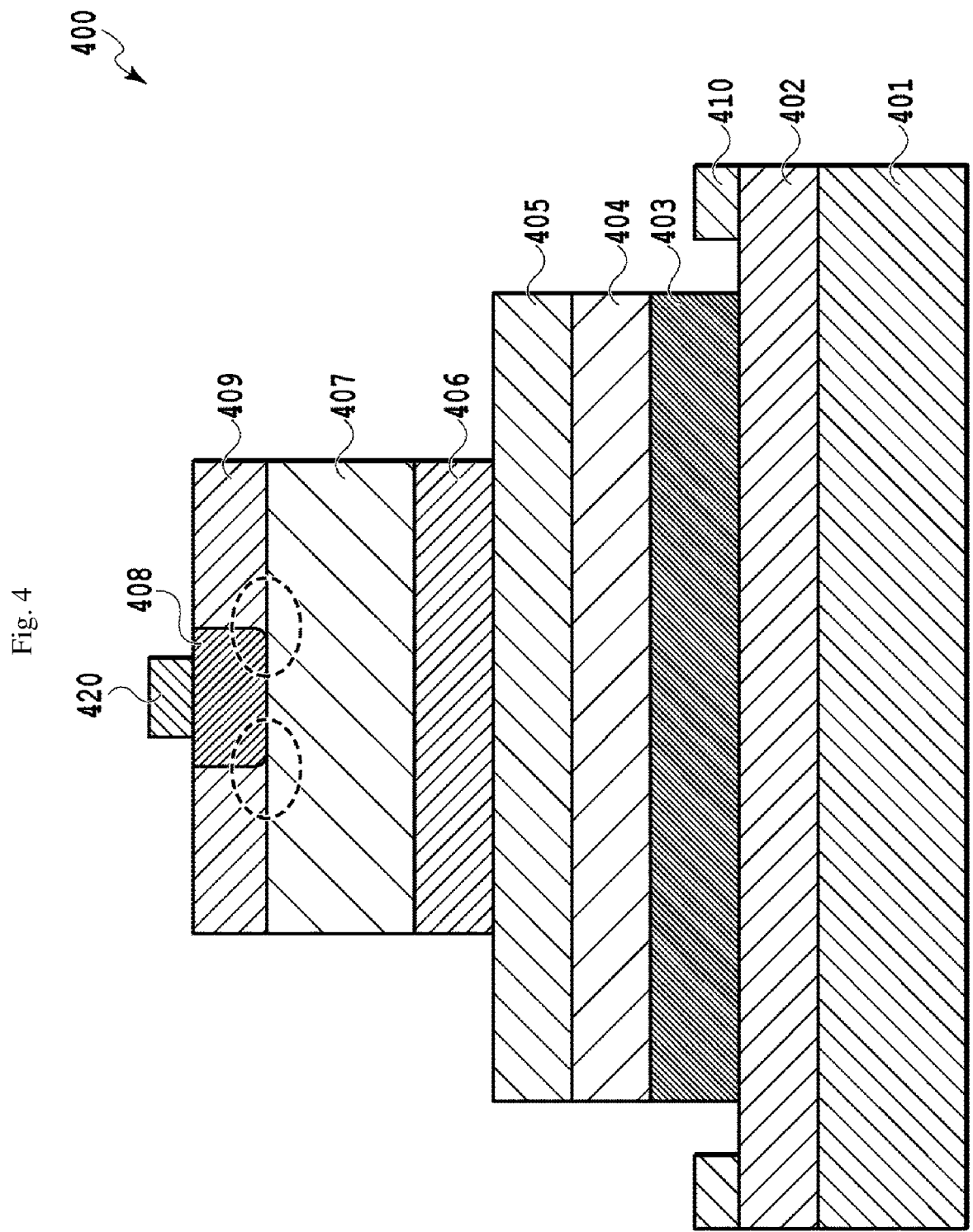
FIG. 4 is a cross-sectional view of a substrate of an avalanche photodiode according to a fourth embodiment.

A structure of a fourth embodiment of the present invention will be described with reference to FIG. 4. FIG. 4 is a cross-sectional view of a substrate of an avalanche photodiode (APD) 400 illustrating the fourth embodiment. In the fourth embodiment, generally, the PN polarity is reversed without changing the order of layers of the first embodiment, a direction of the electric field is opposite to that of the first embodiment (FIG. 1), and the layer configuration is a so-called multi-stage mesa structure.

In the APD 400 in FIG. 4, an N-type InP contact layer 402, a InGaAs light absorbing layer 403, an N-type InP electric field control layer 404, an InP multiplication layer 405, a P-type InP electric field control layer 406, an InAlAs electric field relaxation layer 407, and an InAlAs cap layer 409 are grown in this order on an InP substrate 401 and layered in a mesa structure.

After crystal growth, a doping region is selectively formed in the center portion of the InAlAs cap layer 409 by a Zn selective diffusion method to make a P-type contact layer 408 which is connected to an electrode 420. In addition, etching is performed up to the P-type InP electric field control layer 406 by typical wet etching to form a two-step mesa.

An operation principle of a light receiving element according to the fourth embodiment in FIG. 4 will be described. When a voltage is applied to the APD 400 of the present embodiment, an electric field intensity of the InP multiplication layer 405 first increases, and at the same time, depletion of the P-type and N-type InP electric field control layers 406, 404 disposed as the upper and lower layers thereof proceeds. After the P-type electric field control layer 406 has been depleted, electric field intensities of the InAlAs electric field relaxation layer 407 and the InGaAs light absorbing layer 403 increase for a further applied voltage.

Similarly to the above embodiments, the electric field intensity of the InAlAs electric field relaxation layer 407 is kept small to suppress edge breakdown of the electric field relaxation layer 407 itself, and at the same time, the P-type contact layer 408 and the InP multiplication layer 405 are spatially separated to suppress edge breakdown at the multiplication layer 405. Furthermore, the electric field relaxation layer 407 is composed of InAlAs having a large band gap (1.45 eV), and thus an effect of edge breakdown in the InAlAs electric field relaxation layer 407 can be eliminated.

In addition, in the present APD 400, the P-type InP electric field control layer 406 is not present above a peripheral portion of the InP multiplication layer 405. Due to this, in the APD 400 of the fourth embodiment, even if a voltage is applied, the electric field does not rise around or on the side surface of a lower mesa including the multiplication layer 405 and the absorbing layer 403 in principle. As a result, side dark current causing dark current in the light receiving element can be suppressed.

According to the above-described principle, with the configuration of the fourth embodiment, it is possible to suppress edge breakdown even in a state where the gain of the APD is large, and to reduce the side dark current. As a result, it is possible to improve the sensitivity of the APD optical receiver and the reliability thereof.

Fifth Embodiment

Figure 5:
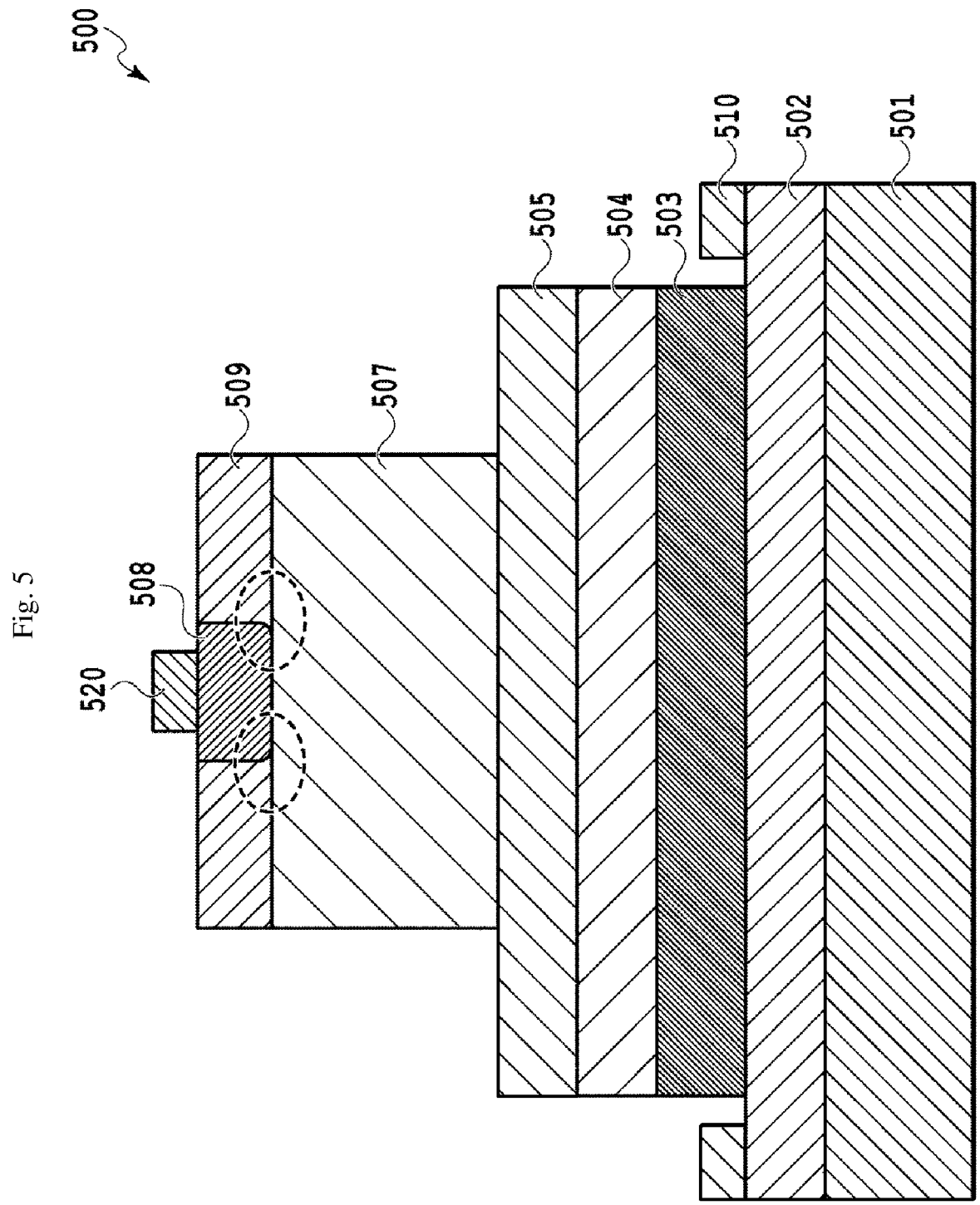
FIG. 5 is a cross-sectional view of a substrate of an avalanche photodiode according to a fifth embodiment.

A structure of a fifth embodiment of the present invention will be described with reference to FIG. 5. FIG. 5 is a cross-sectional view of a substrate of an avalanche photodiode (APD) 500 illustrating the fifth embodiment. The fifth embodiment is an embodiment in which the P-type InP electric field control layer is removed in the fourth embodiment to simplify the configuration.

An operation principle of a light receiving element according to the fifth embodiment will be described. When a voltage is applied to the APD 500 of the fifth embodiment in FIG. 5, an electric field intensity of an InP multiplication layer 505 first increases, and at the same time, an electric field intensity of an InAlAs electric field relaxation layer 507 also increases. In addition, depletion of an N-type InP electric field control layer 504 disposed as a lower layer thereof proceeds. After the N-type electric field control layer 504 has been depleted, an electric field intensity of an InGaAs light absorbing layer 503 increases for a further applied voltage.

In the case of the fifth embodiment, the electric field intensity of the InGaAs light absorbing layer 503 is kept small at an operating voltage of the APD 500, but an electric field intensity of the electric field relaxation layer 507 increases similarly to that of the multiplication layer 505. However, when a material having a band gap energy higher than that of the multiplication layer 505 (e.g., 0.8 eV or greater) is intentionally used as a semiconductor material constituting the electric field relaxation layer 507, the electric field relaxation layer 507 can be configured to have a higher breakdown voltage than that of the multiplication layer even with the same electric field intensity.

As a result, even if an edge electric field caused by the P-type contact layer 508 occurs, it is possible to suppress edge breakdown in the multiplication layer 505 while eliminating an influence of the edge electric field in the InAlAs electric field relaxation layer 507.

In addition, as can be seen in FIG. 5, in the fifth embodiment, the InAlAs electric field relaxation layer 507 is set to have an area smaller than that of the InP multiplication layer 505 and greater than that of the P-type contact region 508. As a result, even in the operating voltage of the APD 500, no high electric filed occurs on the side surfaces of the electric field relaxation layer 507 and the multiplication layer 505, so that the side dark current can be reduced and element degradation from the side surface can be suppressed.

According to the above-described principle, with the configuration of the fifth embodiment, it is possible to suppress edge breakdown even in a state where the gain of the APD is great, so that the side dark current can be reduced. As a result, it is possible to improve the sensitivity of the APD optical receiver and the reliability thereof.

INDUSTRIAL APPLICABILITY

With the structures of the avalanche photodiodes (APDs) of the present invention described above, it is possible to suppress edge breakdown even in a state where the gain of the APD is large, so that an APD optical receiver with improved sensitivity can be realized.

The invention claimed is:

1. An avalanche photodiode comprising:
   a first semiconductor contact layer in contact with a first electrode;
   a second semiconductor contact layer in contact with a second electrode; and
   a multiplication layer formed between the first semiconductor contact layer and the second semiconductor contact layer, wherein the first semiconductor contact layer has smaller area than an area of the multiplication layer;
   a cap layer located at a periphery of the first semiconductor contact layer;
   a light absorbing layer formed between the first semiconductor contact layer and the second semiconductor contact layer; and,
   an electric field relaxation layer configured to be depleted at an operating voltage between the first semiconductor contact layer and the multiplication layer,
   wherein:
      an electric field intensity of the electric field relaxation layer is 300 kV/cm or less in an operating state; and,
      an area of the electric field relaxation layer is equal to or less than an area of the multiplication layer and is greater than an area of the first semiconductor contact layer,
      the first semiconductor contact layer and the cap layer are spatially separated from the multiplication layer, and the first semiconductor contact layer and cap layer are spatially separated from the light absorbing layer; and,
      the cap layer and the electric filed relaxation layer are each made of different materials.

2. The avalanche photodiode according to claim 1, wherein
   the electric field relaxation layer has a film thickness of 100 nm or greater, and is doped in a concentration range of $1 \times 10^{15}$ cm$^{-3}$ to $1 \times 10^{17}$ cm$^{-3}$.

3. The avalanche photodiode according to claim 1, wherein
   a band gap energy of a semiconductor constituting the electric field relaxation layer is greater than a band gap energy of the multiplication layer and is 0.8 eV or greater.

4. The avalanche photodiode according to claim 1, the avalanche photodiode having a backside illumination structure in which light to be detected is incident from a back surface side of a substrate.

5. The avalanche photodiode having the backside illumination structure according to claim 4, the avalanche photodiode having a structure in which a mirror is disposed on a front surface side of the substrate to reflect light transmitted through the light absorbing layer and the reflected light is again incident on the light absorbing layer.

6. The avalanche photodiode according to claim 1, wherein:
   the first semiconductor contact layer includes N-type InAlAs;
   the second semiconductor contact includes P-type InP;
   the multiplication layer layer includes InAlAs;
   the light absorbing layer includes undoped InGaAs;
   the cap layer includes InAlAs; and,
   the electric field relaxation layer includes InP.

* * * * *